United States Patent [19]

Choi et al.

[11] Patent Number: 5,859,454
[45] Date of Patent: Jan. 12, 1999

[54] NONVOLATILE MEMORY DEVICE

[75] Inventors: Woong Lim Choi; Kyeong Man Ra, both of Chungcheongbuk-do, Rep. of Korea

[73] Assignee: LG Semicon Co., Ltd., Chungcheongbuk-Do, Rep. of Korea

[21] Appl. No.: 852,022

[22] Filed: May 6, 1997

[30] Foreign Application Priority Data

Nov. 15, 1996 [KR] Rep. of Korea .................. 1996 54391

[51] Int. Cl.⁶ .......................... H01L 29/76; H01L 29/788
[52] U.S. Cl. .......................... 257/316; 257/314; 257/321; 257/324
[58] Field of Search .................................... 257/314, 315, 257/316, 319, 320, 321, 324; 438/257–264

[56] References Cited

U.S. PATENT DOCUMENTS

| | | | |
|---|---|---|---|
| 5,043,940 | 8/1991 | Harari | 365/168 |
| 5,168,465 | 12/1992 | Harari | 257/320 |
| 5,422,842 | 6/1995 | Cernea et al. | 365/185 |
| 5,583,810 | 12/1996 | Van Houdt et al. | 257/320 |
| 5,587,332 | 12/1996 | Chang et al. | 257/316 |
| 5,637,897 | 6/1997 | Oyama | 257/321 |
| 5,644,528 | 7/1997 | Kojima | 257/315 |

*Primary Examiner*—Tom Thomas
*Assistant Examiner*—Cuong Quang Nguyen
*Attorney, Agent, or Firm*—Morgan, Lewis & Bockius LLP

[57] ABSTRACT

A nonvolatile memory device includes a floating gate for storing a charge carrier during programming, a program gate coupled to the floating gate and performing programming by injecting the charge carrier induced from the outside during programming into the floating gate, an erasure gate coupled to the floating gate and emitting the charge carrier stored in the floating gate to the outside during erasure to outside, a control gate coupled to the floating gate and controlling an amount of the charge carrier provided from the program gate to the floating gate during programming, and a transistor coupled to the floating gate and verifying the amount of the charge carrier provided form the program gate during programming, the transistor including a channel region and source and drain regions.

9 Claims, 8 Drawing Sheets

NONVOLATILE MEMORY DEVICE

This application claims the benefit of Korean Patent Application No. 54391/1996, filed Nov. 15, 1996, which is hereby incorporated by reference.

BACKGROUND OF THE INVENTION

1. Field of the Invention

The present invention relates to a semiconductor device, and more particularly to a nonvolatile memory device. Although the present invention is suitable for a wide scope of applications, it is particularly suitable for reducing a cell size.

2. Discussion of the Related Art

Nonvolatile memory devices, such as flash EEPROMs and flash memory cards, are one of the most active areas in research and development throughout the semiconductor industry.

Generally, in using nonvolatile semiconductor memory devices, such as EEPROM and flash EEPROM, as mass storage media, one of the serious drawbacks is a high cost-per-bit of the memories. Furthermore, when the nonvolatile memories are applied to portable products, low power consumption is required to be used in nonvolatile memory chips. Thus, a multibit-per-cell has been studied to lower the cost-per-bit in the nonvolatile memory device.

The data density of a conventional nonvolatile memory lies in a one to one fashion to the number of memory cells. However, since a multibit cell stores two-bit data or more in one memory cell, it enhances the density of data on the same chip area without increasing size of the memory cell.

In order to implement the multibit cell, more than three threshold voltage levels should be programmed on each memory cell. For instance, in order to store two-bit data in every cell, the respective cells must be programmed with four ($2^2=4$) threshold levels. The four threshold levels correspond to logic states 00, 01, 10, and 11, respectively.

In the multi-level program, the most critical problem is that the respective threshold voltage levels have a statistical distribution. A typical distribution value is about 0.5V.

When the distribution is reduced by precisely adjusting the respective threshold levels, more levels can be programmed so that the number of bits per cell is increased. A method of programming using repeated programming and verification is generally used to reduce the voltage distribution.

According to this method, a series of voltage pulses are applied to the cells in order to program the nonvolatile memory cell at intended threshold levels. To verify whether a cell reaches an intended threshold level, a reading operation is performed between the respective programming voltage pulses.

During verification, when the verified threshold level reaches the intended threshold level, programming stops. However, the method of repeated programming and verification is not able to reduce the error distribution of the threshold level due to the limited pulse width of a programmed voltage. In addition, since the algorithm of repeated programming and verification is implemented with an additional circuit, the area of peripheral circuits of the chip is increased. Furthermore, the repetitive method prolongs the programming time. In order to solve such a drawback, R. Cernea of SunDisk Co., Ltd. suggested a method of simultaneous programming and verification in U.S. Pat. No. 5,422,842 issued on Jun., 6, 1996.

Figure 1A:
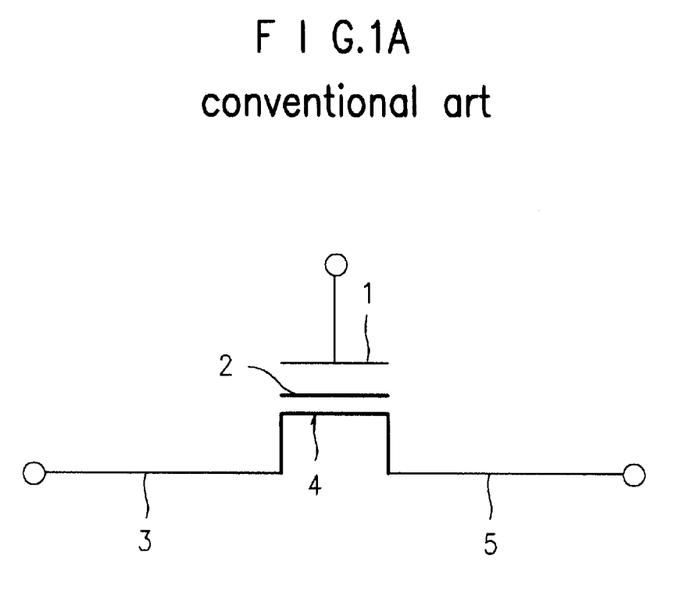
FIG. 1A illustrates a circuit diagram of a general nonvolatile memory cell.

FIG. 1A illustrates a symbol and circuit diagram of a nonvolatile memory, proposed by Cernea. As shown in FIG. 1A, the nonvolatile memory cell includes a control gate 1, a floating gate 2, a source 3, a channel area 4, and a drain 5.

When voltages sufficient to cause programming are applied to the control gate 1 and the drain 5, a current flows between the drain 5 and the source 3. The current is compared to a reference current. When the current reaches a value equal to or smaller than the reference current, a programming completion signal is produced.

Figure 1B:
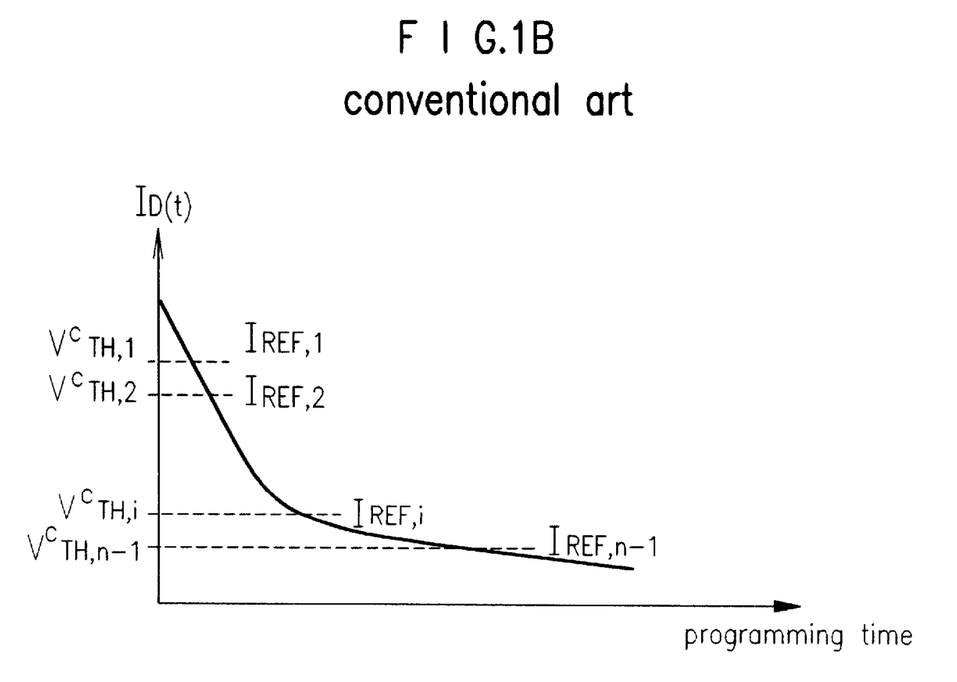
FIG. 1B illustrates a graph explaining an auto-verify programming principle of the nonvolatile memory cell of FIG. 1A.

The above-mentioned procedure is illustrated in FIG. 1B. An auto-verification of a programmed condition with same time programming can compensate for the disadvantage of the repetition of the program verification to some extent. However, R. Cernea suggests using neither a separate program gate for programming operation nor a structure having separated paths for programming and sensing (or verifying) current. Moreover, the threshold level cannot be adjusted by a voltage applied to the control gate of the memory cell. Therefore, separate optimization of the operations for programming and sensing is not feasible. Since the programming current and the monitoring current are not separated from each other, it is hard to directly control the threshold voltage of cell.

On the other hand, U.S. Pat. No. 5,043,940, issued on Aug. 27, 1991, discloses a method of executing a multi-level programming where voltages applied to each terminal of the memory cell are fixed while reference currents for respective levels are varied. However, even in this method, as shown in FIG. 1B, the relation between the reference currents for detection and the cell threshold voltages is neither explicit nor linear.

Therefore, the aforementioned prior art such as a current controlled type programming method still has a disadvantage in that a direct and effective multi-level control is not easy.

In order to eliminate these problems, a programming method of a voltage control type controlling the threshold voltage of a cell by means of a voltage applied to the control gate of the cell has been disclosed in copending U.S. patent application Ser. No. 08/542,651, filed Oct. 13, 1995, which is hereby incorporated by reference. According to this method, a shift of the threshold voltage of a cell is identical to a shift of the control gate voltage. Therefore, the threshold voltage is adjusted precisely.

Cell structures of EEPROM and flash EEPROM can be classified into two kinds depending upon the position of a floating gate on a channel region.

One is a simple stacked gate structure in which the floating gate fully covers the channel region and the other is a split-channel structure in which the floating gate covers only a portion of the channel region between source and drain. The channel region without the floating gate is called a select transistor. The select transistor and the floating gate transistor are included in a memory cell and connected in series with each other.

The split-channel type cell is also classified into two types depending upon methods of forming the select transistor; a merged-split-gate and a split-gate-cell.

In the merged-split-gate cell, a control gate electrode of the floating gate transistor and a gate electrode of the select transistor are integrated into one, whereas the control gate electrode of the floating gate transistor and the gate electrode of the select transistor are separated from each other in the split-gate-cell. The select transistor has been introduced to prevent a problem of over-erasure and to make the formation of contactless virtual ground array easily. Besides, the split-gate-cell makes a hot electron injection from a source side easier.

Figure 2A:
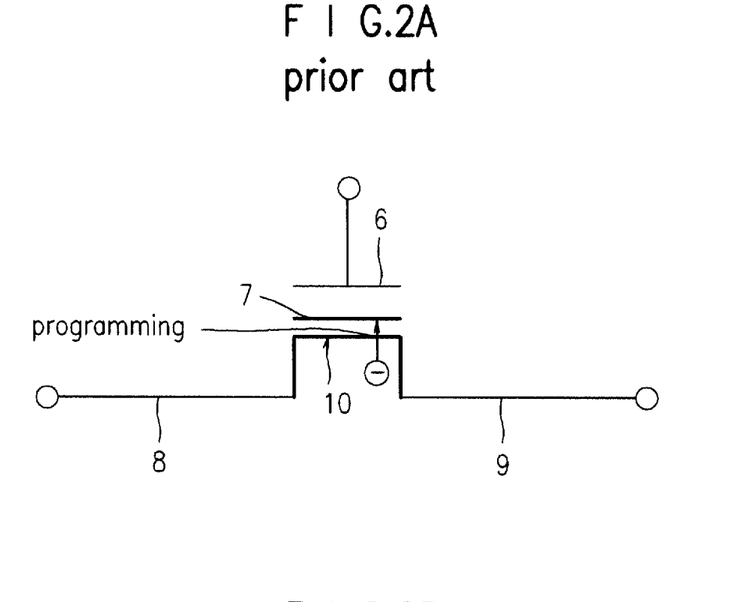
FIG. 2A illustrates a circuit diagram of a prior art nonvolatile memory cell of a simple stacked gate structure.
Figure 2B:
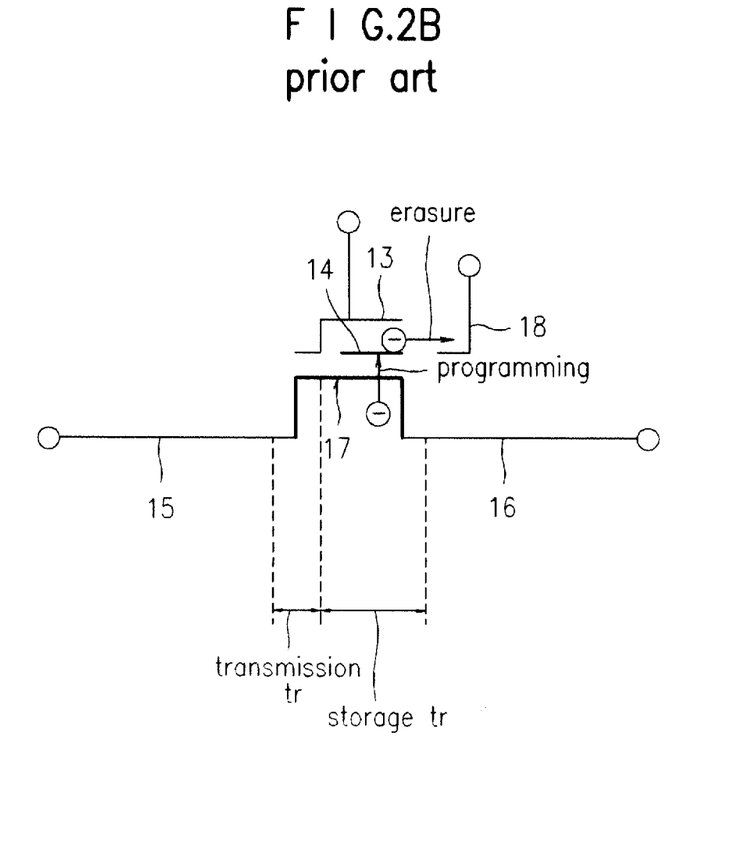
FIG. 2B illustrates a circuit diagram of a prior art nonvolatile memory cell of a split-channel structure.

FIG. 2A illustrates a diagram of a conventional nonvolatile memory cell of the simple stacked gate type, and FIG. 2B illustrates a diagram of a conventional nonvolatile memory cell of the split channel type. FIGS. 2A and 2B illustrate structures of conventional nonvolatile memory cells together with erasure and programming processes. As shown in FIG. 2A, the simple stacked gate type memory cell includes a control gate 6, a floating gate 7, a source 8, a drain 9, and a channel region 10. As shown in FIG. 2B, the split channel type memory cell includes a control gate 13, a floating gate 14, a source 15, a drain 16, a channel region 17, and a gate 18 for erasure.

Referring to FIG. 2B, since the erasure gate 18 is not needed during the programming operation, each of the conventional cells shown in FIGS. 2A and 2B actually becomes a structure the same as a double polygate structure.

In summary, in considering all of the prior art up to now, since a programming has been executed only with electrodes of the control gate, the source and/or the drain, it is difficult to separate paths for programming and verifying (or sensing) current within a memory cell. Therefore, a direct and effective multi-level control is difficult in memory cell.

While the merged-split-gate cell employs a drain side hot electron injection mechanism as a programming method, the split-gate cell employs a source side hot electron injection mechanism as a programming method. Like other EEPROMs, FN (Folwer-Nordheim) tunneling is employed for erasure.

The split-channel cells, using hot electron injection mechanism, need more power consumption in programming than in tunneling. In hot carrier injection, the merged-split-gate cell cannot easily execute two different kinds of ion injection into the drain region, whereas there are problems in optimizing an oxide film thickness between the select transistor and the floating gate transistor as well as preventing degradation of the read current caused by degradation of the oxide film in the split gate cell.

In the conventional split-channel cell, the electron injection(programming and data writing) has been carried out by hot carrier injection through a gate oxide film adjacent to the channel, and the electron erasure(deletion of data) has been carried out through a third gate, a control gate, or a gate oxide film adjacent to a channel.

Since the nonvolatile memory device disclosed in the previously mentioned application Ser. No. 08/542,651 employs a program gate as well as a gate oxide film for erasure, the gate oxide film must be formed with a thickness of 10 nm or below and requires an additional process for forming the high purity gate oxide film. In addition, ONO (Oxide/Nitride/Oxide) structure is required between the floating gate and the control gate so as not to reduce coupling due to such an erasure method. Thus, by employing the program gate for erasure, writing operations in the polyoxide film is improved.

SUMMARY OF THE INVENTION

Accordingly, the present invention is directed to a nonvolatile memory device that substantially obviates one or more of the problems due to limitations and disadvantages of the related art.

One object of the present invention is to provide a nonvolatile memory device including a stacked gate structure having three gates to perform programming and erasure through a gate over a substrate to reduce a cell size.

Other object of the present invention is to provide a nonvolatile memory device capable of improving reliability of a gate oxide film without tunneling through the gate oxide film.

Another object of the present invention is to provide a nonvolatile memory device in which a program current path and verification current path during programming are separated from each other to perform an optimal verification regardless of program.

Further object of the present invention is to provide a nonvolatile memory device in which a program gate and an erasure gate are employed for programming and erasure, respectively. That is, the program gate is employed with a program line parallel to a bit line and the erasure gate is employed with an erasure line parallel to a word line. Thus, programming by selecting any cell is performed as well as blocking erasure is easily achieved when at least one or two word lines in erasure block is applied to form a flash memory.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a nonvolatile memory device includes a floating means for storing charge carrier during programming, a program means for performing programming by injecting charge carrier induced from outside during programming into the floating means, an erasure means for emitting the charge carrier stored in the floating means during erasure to outside, a control means for controlling an amount of the charge carrier provided from the program means to the floating means during programming, and a verification means for verifying the amount of the charge carrier provided from the program gate during programming.

In another aspect of the present invention, a nonvolatile memory device includes a floating gate for storing a charge carrier during programming, a program gate coupled to the floating gate and performing programming by injecting a charge carrier induced from the outside during programming into the floating gate, an erasure gate coupled to the floating gate and emitting the charge carrier stored in the floating gate to the outside during erasure to outside, a control gate coupled to the floating gate and controlling an amount of the charge carrier provided from the program gate to the floating gate during programming, and a transistor coupled to the floating gate and verifying the amount of the charge carrier provided form the program gate during programming, the transistor including a channel region and source and drain regions.

In another aspect of the present invention, a nonvolatile memory device includes a first conductive type semiconductor substrate, a floating gate on the semiconductor substrate, a program gate on the semiconductor substrate at a first side of the floating gate, an erasure gate on the semiconductor substrate at a second side of the floating gate, a control gate over the floating gate and second conductive type source and drain regions on the semiconductor substrate at the first and second sides of the floating gate.

In a further aspect of the present invention, a nonvolatile memory device includes a semiconductor substrate, a plurality of bit line regions on the semiconductor substrate in one direction at predetermined intervals, a plurality of floating gates arranged between the respective bit line regions over the semiconductor substrate in a matrix arrangement, a plurality of erasure lines between the respective floating gates in a direction perpendicular to the bit line regions over the semiconductor substrate, a plurality of word lines between the respective erasure lines over the floating gates, and a plurality of program lines perpendicular to the word lines and between the respective bit line regions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings.

Figure 3A:
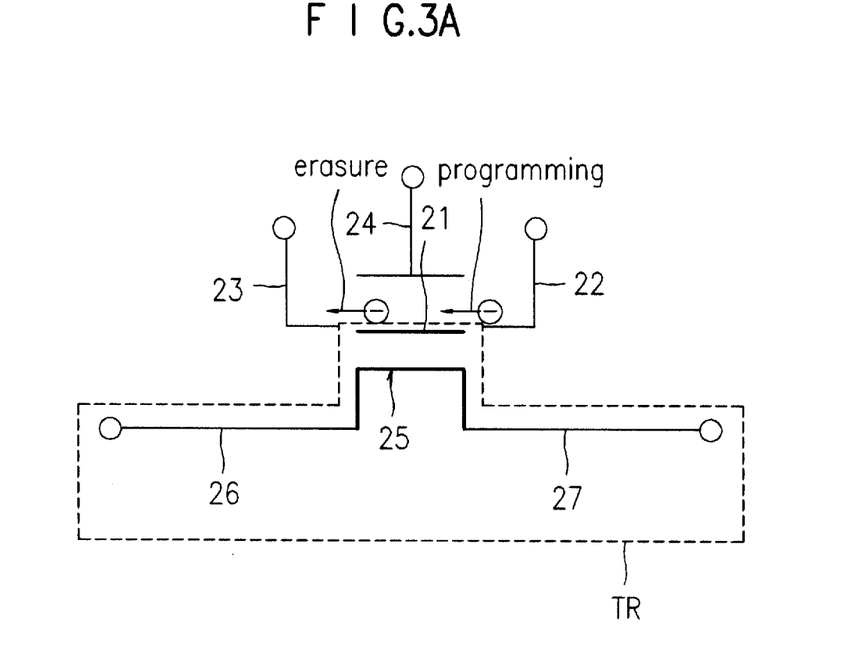
FIG. 3A illustrates a circuit diagram of a nonvolatile memory cell in accordance with the present invention.

FIG. 3A illustrates a circuit diagram of a nonvolatile memory cell in accordance with the present invention.

A nonvolatile memory cell of the present invention includes a floating gate 21 for storing charge carrier during programming, a program gate 22 for performing programming by injecting charge carriers induced from the outside during programming into the floating gate 21, an erasure gate 23 for emitting the charge carrier stored in the floating gate 21 to the outside during erasure, a control gate 24 for controlling an amount of charge carriers provided from the program gate 22 to the floating gate 21 during programming, a transistor TR having the floating gate 21, a channel region 25, a source 26, and a drain 27 for verifying the amount of charge carrier provided from the program gate 22 during programming.

Figure 3B:
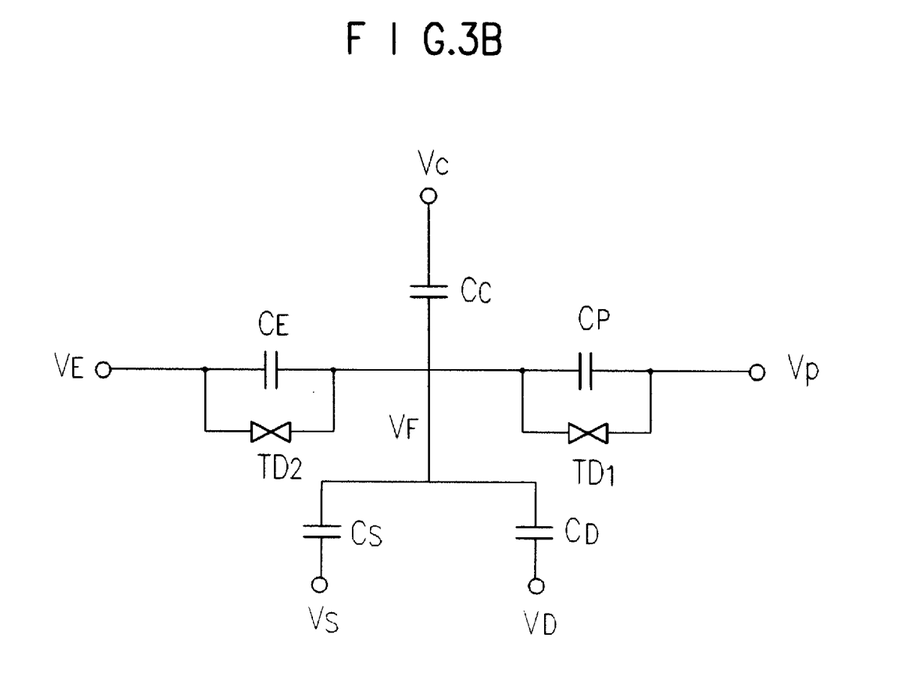
FIG. 3B illustrates a circuit diagram showing the nonvolatile memory cell of FIG. 3A in view of functions.

FIG. 3B illustrates a circuit diagram showing the nonvolatile memory cell of FIG. 3A in view of functions.

Referring to FIG. 3B, $V_P$ represents a voltage of the program gate 22 for programming, $V_E$ a voltage of the erasure gate 23 for erasure, $V_F$ a voltage of the floating gate 21 for storing the charge carriers through the program gate 22 during programming and for providing the charge carriers stored during erasure to the erasure gate, $V_C$ a voltage of the control gate 24 for controlling the amount of charge carriers provided from the program gate 22 to the floating gate 21 for programming, $V_S$ a source voltage of the transistor TR for verifying the amount of charge carrier stored in the floating gate 21, and $V_D$ a drain voltage. Further, a first capacitor $C_C$ is formed between the control gate 24 and the floating gate 21. A second capacitor $C_P$ capable of tunneling for programming is formed between the program gate 24 and the floating gate 21. A third capacitor $C_E$ capable of tunneling for erasure is formed between the erasure gate 23 and the floating gate 21. A fourth capacitor $C_S$ is formed between a source region 26 and the floating gate 21. Finally, a fifth capacitor $C_D$ is formed between a drain region 27 and the floating gate 21.

A configuration of the nonvolatile memory device of the present invention having the nonvolatile memory cell as aforementioned will be described below.

Figure 4:
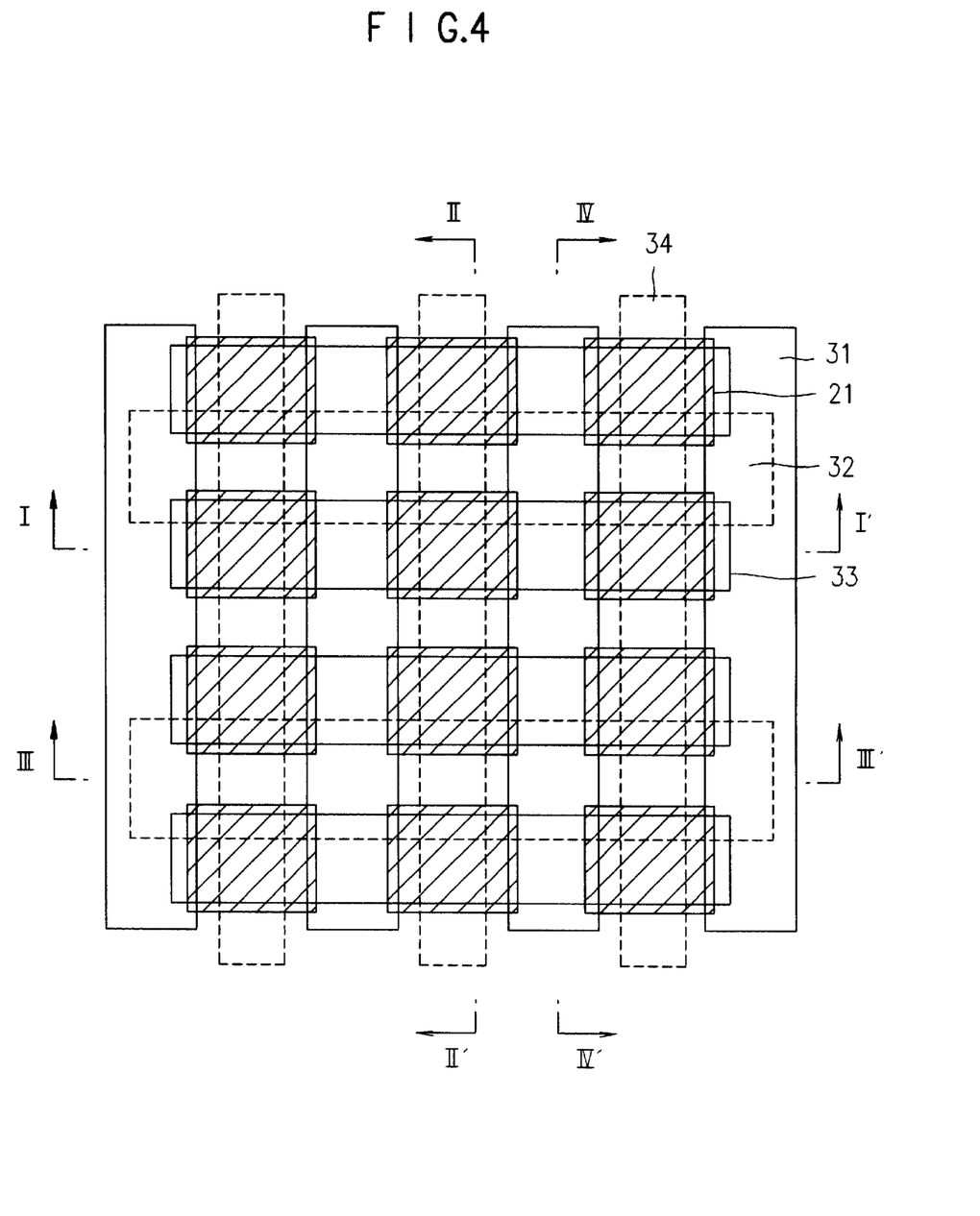
FIG. 4 illustrates a layout of the nonvolatile memory device in accordance with the present invention.

FIG. 4 illustrates a layout of the nonvolatile memory device in accordance with the present invention.

In the nonvolatile memory device of the present invention, a plurality of bit line regions 31 are formed on a semiconductor substrate(not shown) in one direction at predetermined intervals. The respective bit line regions act on an impurity region. The bit line regions correspond to source and drain regions 26 and 27 in the memory cell shown in FIG. 3A. A plurality of erasure lines 32 perpendicular to the bit lines 31 are formed on the semiconductor substrate at predetermined intervals. The erasure lines 32 correspond to the erasure gate 23 in the memory cell shown in FIG. 3A. A plurality of floating gates 21 having island shapes are formed between the respective bit lines 31 and between the respective erasure lines 32 in a matrix arrangement. A plurality of word lines 33 parallel to the erasure lines 32 are formed between the erasure lines 32 on the semiconductor substrate at predetermined intervals. Here, the respective word lines 33 overlap the plurality of floating gates 21 and correspond to the control gate 24 in the memory cell shown in FIG. 3A. A plurality of program lines 34 parallel to the bit lines 31 are formed on the semiconductor substrate between the respective bit lines 31. Here, the respective program lines 34 overlap the plurality of floating gates 21 and correspond to the program gate 22 in the memory cell shown in FIG. 3A.

The bit lines 31, the floating gates 21, the word lines 33, the erasure lines 32, and the program lines 34 are separated from one another.

Cross-sectional structures of the nonvolatile memory device as aforementioned will now be described with reference to FIGS. 5 to 8.

Figure 5:
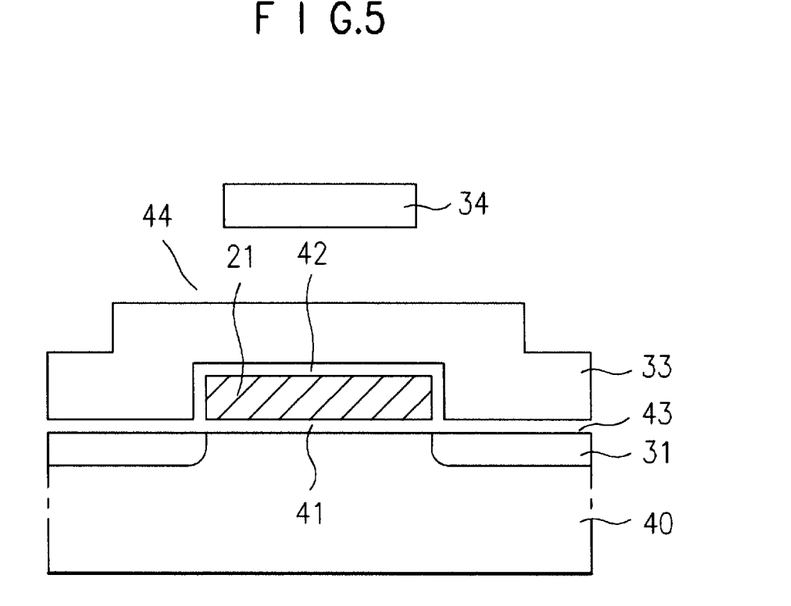
FIG. 5 illustrates a cross-sectional view taken along I–I' line of FIG. 4 in accordance with a first embodiment of the present invention.
Figure 6:
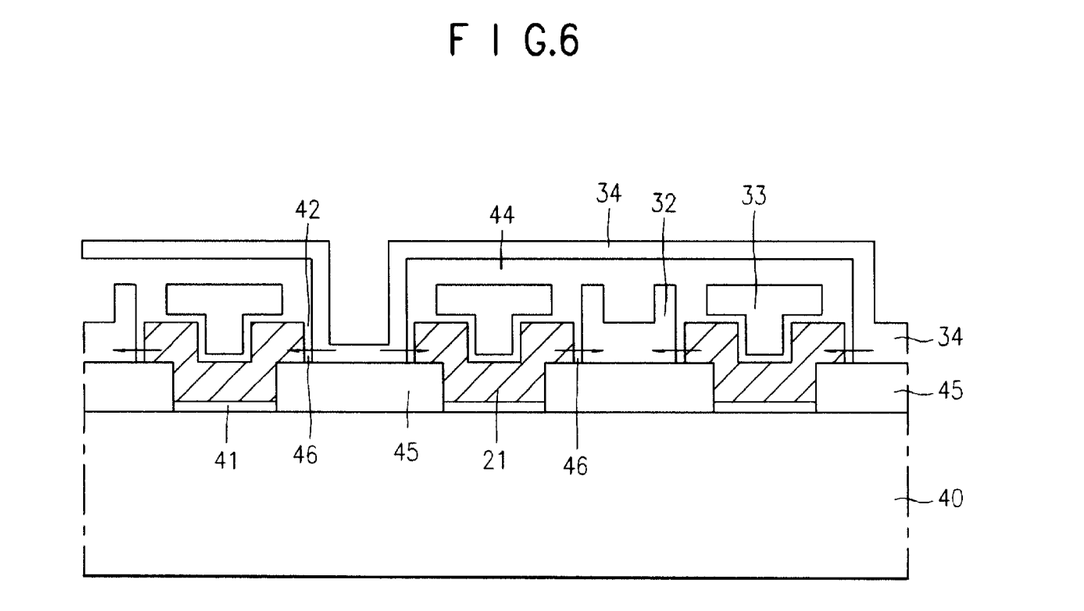
FIG. 6 illustrates a cross-sectional view taken along II–II' line of FIG. 4 in accordance with a first embodiment of the present invention.
Figure 7:
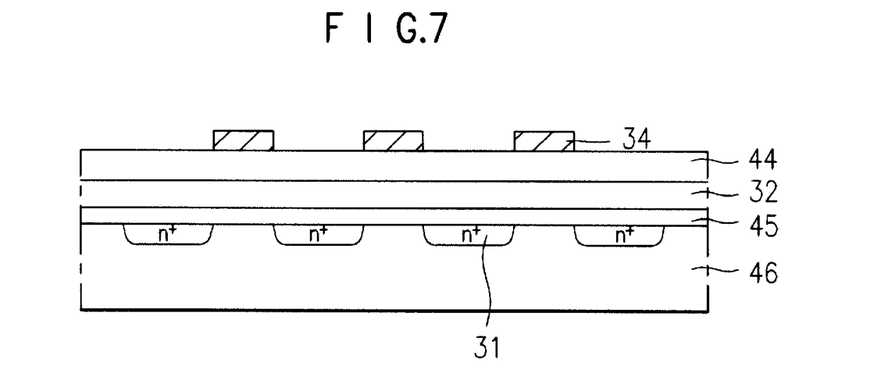
FIG. 7 illustrates a cross-sectional view taken along III–III' line of FIG. 4 in accordance with a first embodiment of the present invention.
Figure 8:
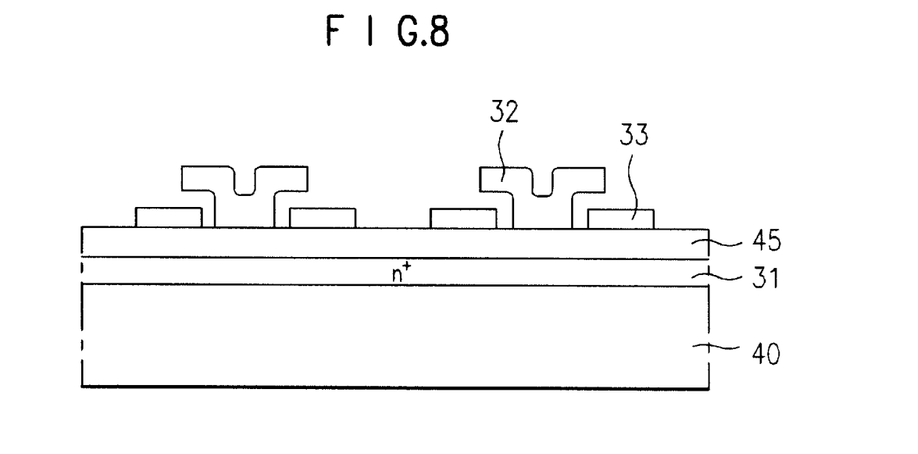
FIG. 8 illustrates a cross-sectional view taken along IV–IV' line of FIG. 4 in accordance with a first embodiment of the present invention.

FIG. 5 illustrates a cross-sectional view taken along I–I' line of FIG. 4 in accordance with a first embodiment of the present invention. FIG. 6 illustrates a cross-sectional view taken along II–II' line of FIG. 4. FIG. 7 illustrates a cross-sectional view taken along III–III' line of FIG. 4. FIG. 8 illustrates a cross-sectional view taken along IV–IV' line of FIG. 4.

As described above, the program lines 34, the erasure lines 32, the word lines 33, and the bit lines 31 correspond to the program gate 22, the erasure gate 23, the control gate 24, and the source and drain 26 and 27, respectively. The respective lines act on the respective gates without any additional contact region.

In a cross-section of the word line 33 as shown in FIG. 5, the floating gate 21 is formed on a semiconductor substrate 40 and a gate insulating film 41 is formed between the floating gate 21 and the substrate 40. A bit line region 31 having an n-type high impurity region is formed on the semiconductor 40 at both sides of the floating gate 21 by ion implantation. The gate insulating film 41 may be thicker than a tunneling insulating film (not shown in FIG. 5).

A word line 33 is formed over the floating gate 21 and the bit line region 31, and a program line 34 is formed over the word line 33 in the direction perpendicular to the word line 33.

Dielectric insulating films 41 and 42 are formed between the floating gate 21 and the word line 33. The dielectric insulating film 42 may be formed by an oxide film instead of a dielectric layer having a high dielectric constant such as ONO.

Further, thick insulating films 43 and 44 are formed between the word line 33 and the semiconductor substrate 40 and between the word line 33 and the program line 34.

In a cross-section of the program line 34 as shown in FIG. 6, a field oxide film 45 is formed at an isolation region of the semiconductor substrate 40 to separate cells from each other and a portion of the floating gate 21 formed on an active region may be over the field oxide film 45.

The word line 33 is formed on the floating gate 21 and the erasure line 32 is formed over the field oxide film 45 between the floating gates 21. The erasure line 32 does not occupy the whole portions between the respective floating gates but formed over the field oxide film 45 between the respective floating gates. The program line 34 is formed on the substrate in the direction perpendicular to the word line 33 and the erasure line 32. Also, the program line 34 is formed over the field oxide film 45 where the erasure line 32 is not formed.

The gate insulating film 41 is formed between the floating gate 21 and the semiconductor substrate 40. A thin insulating film, such as an oxide film, is formed between the floating gate 21 and the erasure line 32 adjacent to the floating gate 21 and between the program line 34 and the word line 33. The program line 34 is separated from the word line 33 and the erasure line 32 by a thick insulating film 44.

A tunneling insulating film 46 is formed between the floating gate 21 and the erasure line 32 adjacent to the floating gate 21 and between the floating gate 21 and the program line 34, respectively. Carrier is tunneled to the erasure line 32 from the sides of the floating gate 21 and to the sides of the floating gate 21 from the program line 34 as shown by the arrows in FIG. 6.

In a cross-section of the erasure line 32 as shown in FIG. 7, a plurality of bit line regions 31 having impurity regions are formed on the semiconductor substrate 40 by ion implantation in one direction at predetermined intervals. The field insulating film 45 is formed on the entire portions of the semiconductor substrate 40 (not shown in FIG. 7).

The erasure line 32 is formed over the field insulating film 45 in the direction perpendicular to the bit line regions 31. The insulating film 44 is formed over the erasure line 32. The program line 34 perpendicular to the erasure line 32 and parallel to the bit line regions 31 is formed over the insulating film 44 between the bit line regions 31.

In a cross-section of the bit line region 31 as shown in FIG. 8, the bit line region 31 is formed on the semiconductor substrate 40 by ion implantation. The field oxide film 45 is formed over the semiconductor substrate 40. The plurality of word lines 33 and erasure lines 32 are formed by turns over the field oxide film 45 in the direction perpendicular to the bit line region 31.

A structure of the nonvolatile memory device for improving tunneling characteristics according to the other embodiments of the present invention will be described below.

Figure 9:
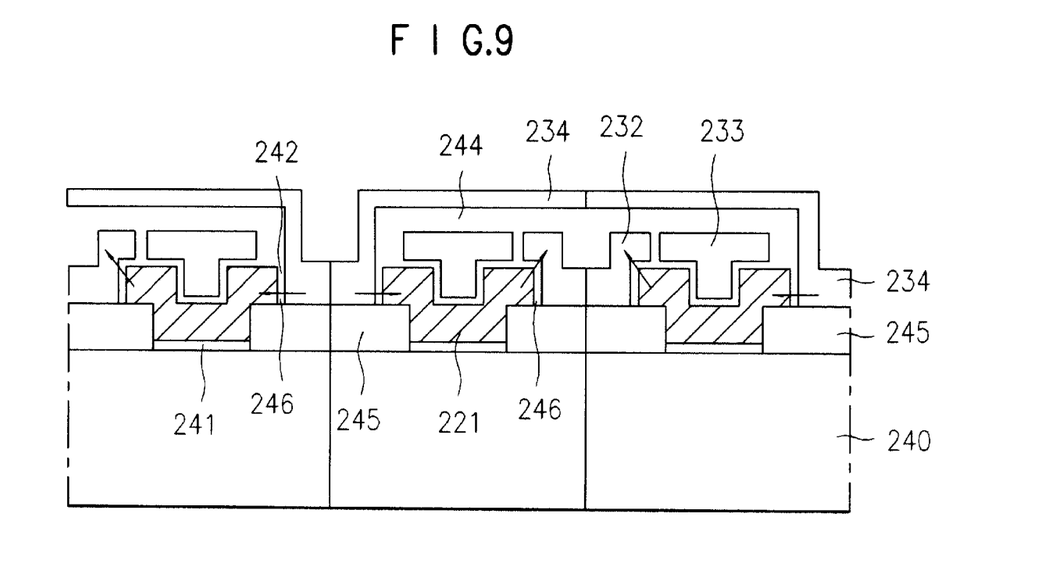
FIG. 9 illustrates a cross-sectional view taken along II–II' line of FIG. 4 in accordance with a second embodiment of the present invention.

FIG. 9 illustrates a cross-sectional view taken along II–II' line of FIG. 4 in accordance with the second embodiment of the present invention.

The nonvolatile memory device according to the second embodiment of the present invention has the same layout as FIG. 4 and the same cross-sectional structure as FIG. 5, FIG. 7, and FIG. 8, but a different cross-sectional structure from FIG. 6.

The bit line region 31 is formed by n-type high impurity region and the method used in FIG. 5. In a cross-section of program line as shown in FIG. 9, the field oxide film 245 is formed at an isolation region of the semiconductor substrate 240 to separate cells from each other and the floating gate 221 is formed at an active region.

The word lines 233 are formed by turns on the floating gate 221 and the erasure line 232 is formed over the field oxide film 245 between the floating gates 221.

The program line 234 is formed over the substrate in the direction perpendicular to the word line 233 and the erasure line 232. Also, the program line 234 is formed over the field oxide film 245 where the erasure line 232 is not formed.

The gate insulating film 241 is formed between the floating gate 221 and the semiconductor substrate 240. Thin insulating films 242 and 246 are formed between the floating gate 221 and the erasure line 232 adjacent to the floating gate 221 and between the program line 234 and the word line 233. The tunneling insulating film 246 is formed between the floating gate 221 and the erasure line 232 and between the floating gate 221 and the program line 234, respectively. The program line 234 is separated from the word line 233 and the erasure line 232 by a thick insulating film 244.

The second embodiment is different from the first embodiment of FIG. 6 because the erasure line 232 overlaps the edge portions of the floating gate 221 adjacent to the erasure line 232. In other words, the erasure line 232 is formed over the edge portions of the floating gate 221 adjacent to the erasure line 232. This structure improves a tunneling characteristic of transferring carrier from the floating gate 221 to the adjacent erasure line 232.

Figure 10:
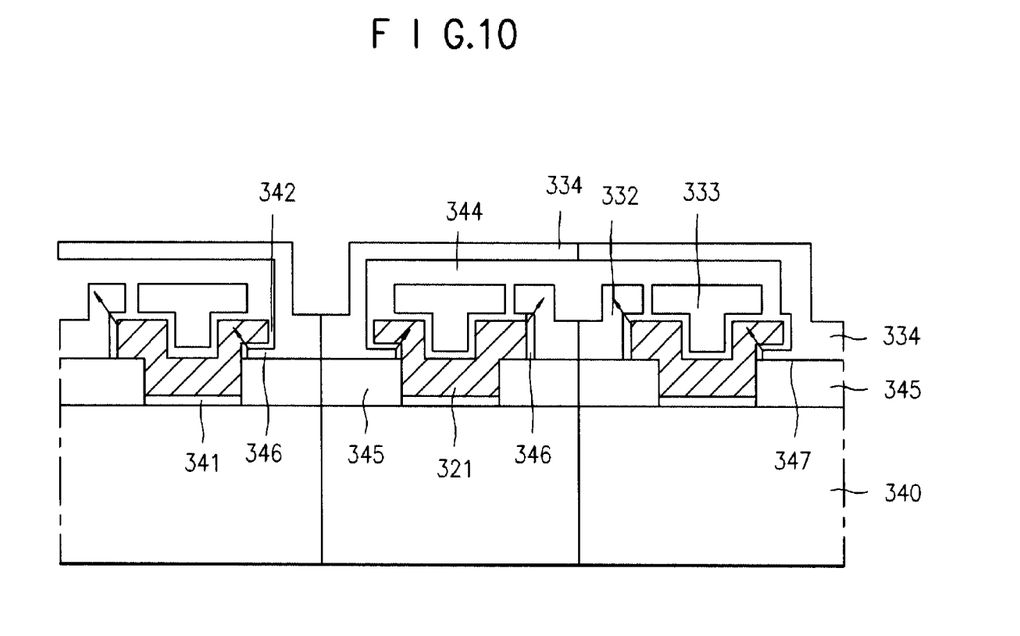
FIG. 10 illustrates a cross-sectional view taken along II–II' line of FIG. 4 in accordance with a third embodiment of the present invention.

FIG. 10 illustrates a cross-sectional view taken along II–II' line of FIG. 4 in accordance with a third embodiment of the present invention.

The program line 334 overlaps the adjacent floating gate 321 while the erasure line 332 overlaps the edge portions of the floating gate 321 as the second embodiment of the present invention shown in FIG. 9.

The program line 334 is formed on the field oxide film 345 to have a projection portion 347 in the direction parallel to the semiconductor substrate 340. The floating gate 321 overlaps the projection portion 347. As a result, a desirable tunneling characteristic is achieved from the program line 334 to the floating gate 321. In addition, the tunneling characteristic from the floating gate 321 to the erasure line 332 is improved. The bit line region 331 is formed by an n-type high impurity region (not shown FIG. 10).

Figure 11:
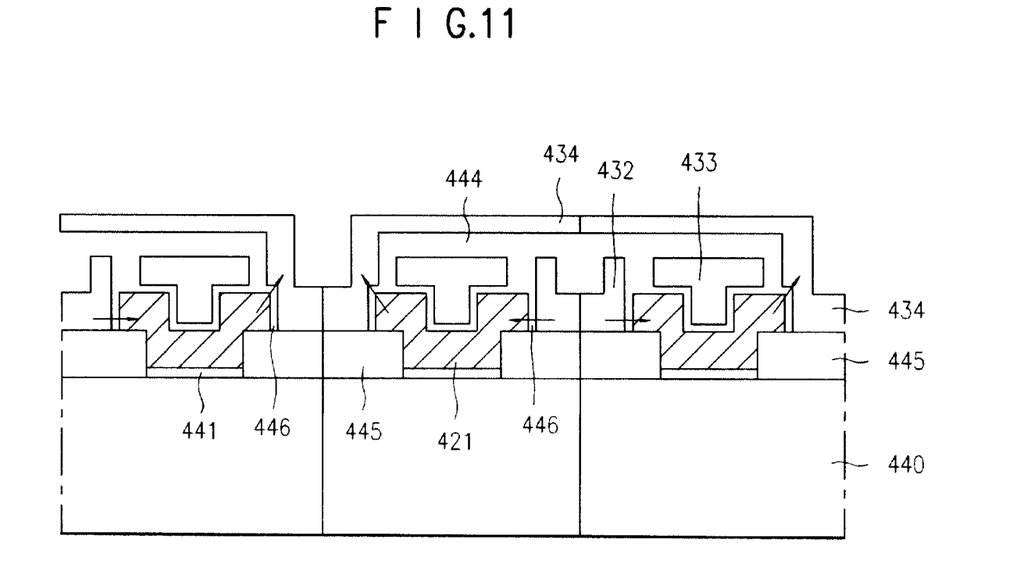
FIG. 11 illustrates a cross-sectional view taken along II–II' line of FIG. 4 in accordance with a fourth embodiment of the present invention.

FIG. 11 illustrates a cross-sectional view taken along II–II' line of FIG. 4 in accordance with a fourth embodiment of the present invention.

Referring to FIG. 11, the bit line region 431 is formed by a p-type high impurity region (not shown in FIG. 11). The floating gate 421 does not overlap the erasure line 432 but overlaps the program line 434. Unlike FIG. 10, the program line 434 does not include a projection portion and overlaps the edge portions of the adjacent floating gate 21 and the field oxide film 445.

Figure 12:
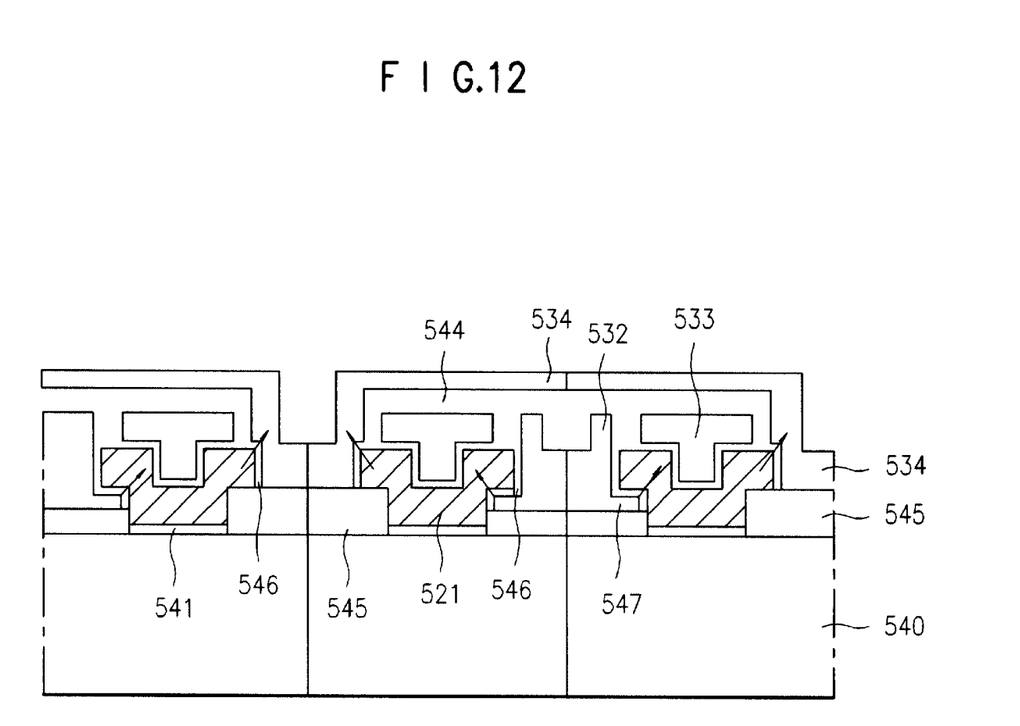
FIG. 12 illustrates a cross-sectional view taken along II–II' line of FIG. 4 in accordance with a fifth embodiment of the present invention.

FIG. 12 illustrates a cross-sectional view taken along II–II' line of FIG. 4 in accordance with a fifth embodiment of the present invention.

Referring to FIG. 12, the bit line region 531 is formed by a p-type high impurity region (not shown in FIG. 12). The floating gate 521 overlaps the adjacent program line 534 and the erasure line 532, respectively. The erasure line 532 is formed at the projection portion 547 over the field oxide film 545 in the direction parallel to the semiconductor substrate 540. The projection portion 547 overlaps the edge portion of the floating gate 521. The program line 534 overlaps the edge portion of the adjacent floating gate 521.

Operation of the nonvolatile memory cell of the present invention as aforementioned will be described below.

The nonvolatile memory device of the present invention performs programming by injecting electrons to the floating gate through the program line and extracts the electrons stored in the floating gate through the erasure line. While executing the programming, the nonvolatile memory device monitors the programmed state through the transistor by having gate, source and drain regions to correspond to the floating gate and the bit line region at both sides of the floating gate, respectively.

In other words, the nonvolatile memory device of the present invention selects a desired memory cell through the word line and the program line and performs programming at the floating gate of the memory cell selected by the program line. Simultaneously, the device monitors the programmed state through the transistor.

Therefore, in case of programming the memory cell at the multi-level threshold voltage, it is possible to program while monitoring so that the memory cell is exactly programmed at a desired threshold voltage.

As described above, the nonvolatile memory device of the present invention is advantageous in the following aspects.

First, since the programming and erasure are performed at an upper portion of the substrate, the bit line region of the substrate performs monitoring and reading, the gate insulating film is not used for a tunneling insulating film, and hot carrier is not used in operation, reliability of the gate insulating film is maintained, junction and channel techniques are simplified, and a cell size is easily reduced.

Second, the line is used without contacting the gate so that a cell size is reduced.

Third, since it is possible to form the thick gate insulating film, a control gate coupling increases, which is suitable for low voltage operation.

Fourth, since the dielectric layer between the control gate and the floating gate can be formed by the oxide film instead of ONO, process steps are simplified.

Fifth, when a polyoxide film is used as program and erasure tunnel materials, effective program and erasure characteristics are achieved by an electric field enhancement due to roughness and geometrical edge effects of the polyoxide film.

Finally, the contactless array by a simple stacked cell structure largely reduces cell size.

The foregoing description of preferred embodiment(s) of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A nonvolatile memory device comprising:
    a semiconductor substrate;
    a plurality of bit line regions on the semiconductor substrate in one direction at predetermined intervals;
    a plurality of floating gates arranged between the respective bit line regions over the semiconductor substrate in a matrix arrangement;
    a plurality of erasure lines between the respective floating gates in a direction perpendicular to the bit line regions over the semiconductor substrate;
    a plurality of word lines between the respective erasure lines over the floating gates; and
    a plurality of program lines perpendicular to the word lines and between the respective bit line regions.

2. The nonvolatile memory device according to claim 1, further comprising a tunneling insulating film between the floating gates and the program lines and between the floating gates and the erasure lines, respectively.

3. The nonvolatile memory device according to claim 1, wherein the program lines and the erasure lines are separated from the semiconductor substrate.

4. The nonvolatile memory device according to claim 1, further comprising a field oxide layer between the program gate and the semiconductor substrate.

5. The nonvolatile memory device according to claim 1, further comprising an insulating layer between the program gate and the erasure gate.

6. The nonvolatile memory device according to claim 1, wherein the bit line regions are formed by n-type high impurity regions and the program lines have a projection portion in a direction of the floating gates adjacent to the program lines and the projection portion is below the adjacent floating gates.

7. The nonvolatile memory device according to claim 1, wherein the bit line regions are formed by n-type high impurity regions and the erasure lines have a projection portion in a direction of the floating gates adjacent to the erasure lines and the projection portion is over the adjacent floating gates.

8. The nonvolatile memory device according to claim 1, wherein the bit line regions are formed by p-type high impurity regions and the program lines have a projection portion in a direction of the floating gates adjacent to the program lines and the projection portion is over the adjacent floating gates.

9. The nonvolatile memory device according to claim 1, wherein the bit line regions are formed by p-type high impurity regions and the erasure lines have a projection portion in a direction of the floating gates adjacent to the erasure lines and the projection portion is below the adjacent floating gates.

* * * * *